US010947618B2

(12) United States Patent
Spagnola et al.

(10) Patent No.: US 10,947,618 B2
(45) Date of Patent: Mar. 16, 2021

(54) BARRIER FILM CONSTRUCTIONS AND METHODS OF MAKING SAME

(71) Applicant: 3M INNOVATIVE PROPERTIES COMPANY, Saint Paul, MN (US)

(72) Inventors: Joseph C. Spagnola, Woodbury, MN (US); Mark A. Roehrig, Stillwater, MN (US); Thomas P. Klun, Lakeland, MN (US); Alan K. Nachtigal, Minneapolis, MN (US); Christopher S. Lyons, Saint Paul, MN (US); Guy D. Joly, Shoreview, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 83 days.

(21) Appl. No.: 16/266,254

(22) Filed: Feb. 4, 2019

(65) Prior Publication Data

US 2019/0180968 A1    Jun. 13, 2019

Related U.S. Application Data

(62) Division of application No. 14/419,352, filed as application No. PCT/US2013/052633 on Jul. 30, 2013, now abandoned.

(Continued)

(51) Int. Cl.
*C23C 14/22* (2006.01)
*C08J 7/04* (2020.01)
(Continued)

(52) U.S. Cl.
CPC .............. *C23C 14/22* (2013.01); *C08J 7/0423* (2020.01); *C23C 14/024* (2013.01); *C23C 14/08* (2013.01);
(Continued)

(58) Field of Classification Search
CPC ...... C08J 7/0423; C08J 7/048; C08J 2433/14; C08J 2433/16; C23C 14/024; C23C 14/12; C23C 14/14; Y10T 428/3185
See application file for complete search history.

(56) References Cited

U.S. PATENT DOCUMENTS 4,696,719 A    9/1987  Bischoff
4,722,515 A    2/1988  Ham
(Continued)

FOREIGN PATENT DOCUMENTS

JP    H09241829    9/1997
JP    2002052639    2/2002
(Continued)

OTHER PUBLICATIONS

Swanson, "Measurement of Web Curl", Applied Web Handling Conference Proceedings, 2006, 30 pages.
(Continued)

*Primary Examiner* — Ling Siu Choi
*Assistant Examiner* — David L Miller
(74) *Attorney, Agent, or Firm* — James A. Baker

(57) ABSTRACT

A barrier film including a substrate; a base polymer layer adjacent to the substrate; an oxide layer adjacent to the base polymer layer; a adhesion-modifying layer adjacent to the oxide layer; and a top coat polymer layer adjacent to the adhesion-modifying layer. An optional inorganic layer can be applied over the top coat polymer layer. The inclusion of a adhesion-modifying layer provides for enhanced resistance to moisture and improved peel strength adhesion of the top coat polymer layer to the underlying barrier stack layers.

5 Claims, 1 Drawing Sheet

Related U.S. Application Data

(60) Provisional application No. 61/779,455, filed on Mar. 13, 2013, provisional application No. 61/680,963, filed on Aug. 8, 2012.

(51) Int. Cl.

| | | |
|---|---|---|
| *C23C 14/02* | (2006.01) | |
| *C23C 14/08* | (2006.01) | |
| *C23C 14/12* | (2006.01) | |
| *C23C 14/34* | (2006.01) | |
| *C23C 14/58* | (2006.01) | |
| *C23C 28/00* | (2006.01) | |
| C23C 14/14 | (2006.01) | |
| C08J 7/048 | (2020.01) | |
| H01J 1/70 | (2006.01) | |

(52) U.S. Cl.
CPC .............. *C23C 14/12* (2013.01); *C23C 14/34* (2013.01); *C23C 14/5806* (2013.01); *C23C 28/00* (2013.01); *C08J 7/048* (2020.01); *C08J 2367/02* (2013.01); *C08J 2433/08* (2013.01); *C08J 2433/10* (2013.01); *C08J 2433/12* (2013.01); *C08J 2433/14* (2013.01); *C23C 14/14* (2013.01); *H01J 1/70* (2013.01); *Y10T 428/31855* (2015.04)

(56) References Cited

U.S. PATENT DOCUMENTS

| | | | |
|---|---|---|---|
| 4,842,893 A | 6/1989 | Yializis | |
| 4,954,371 A | 9/1990 | Yializis | |
| 5,018,048 A | 5/1991 | Shaw | |
| 5,032,461 A | 7/1991 | Shaw | |
| 5,097,800 A | 3/1992 | Shaw | |
| 5,125,138 A | 6/1992 | Shaw | |
| 5,440,446 A | 8/1995 | Shaw | |
| 5,547,908 A | 8/1996 | Furuzawa | |
| 5,770,301 A | 6/1998 | Murai | |
| 5,840,428 A | 11/1998 | Blizzard | |
| 5,877,895 A | 3/1999 | Shaw | |
| 6,010,751 A | 1/2000 | Shaw | |
| 6,045,864 A | 4/2000 | Lyons | |
| 6,214,422 B1 | 4/2001 | Yializis | |
| 6,231,939 B1 | 5/2001 | Shaw | |
| 6,413,645 B1 | 7/2002 | Graff | |
| 6,878,440 B1 | 4/2005 | Yamanaka | |
| 7,018,713 B2 | 5/2006 | Padiyath | |
| 2001/0001284 A1 | 5/2001 | Shaw | |
| 2001/0015620 A1 | 8/2001 | Affinito | |
| 2003/0029493 A1 | 2/2003 | Plessing | |
| 2004/0229051 A1 | 11/2004 | Gillette et al. | |
| 2005/0129841 A1 | 6/2005 | McCormick | |
| 2006/0251905 A1* | 11/2006 | Arakawa | B32B 27/08 428/429 |
| 2007/0099004 A1 | 5/2007 | Edelmann | |
| 2008/0182123 A1 | 7/2008 | Murphy | |
| 2010/0112255 A1 | 5/2010 | Fayet | |
| 2010/0219079 A1 | 9/2010 | Routkevitch | |
| 2011/0052892 A1 | 3/2011 | Murakami | |
| 2011/0223434 A1 | 9/2011 | Roehrig | |
| 2011/0274933 A1* | 11/2011 | Hoshi | B32B 27/08 428/446 |
| 2012/0003448 A1 | 1/2012 | Weigel | |
| 2012/0003451 A1 | 1/2012 | Weigel | |
| 2012/0003484 A1 | 1/2012 | Roehrig | |
| 2012/0160321 A1 | 6/2012 | Hull | |
| 2013/0323519 A1 | 12/2013 | Klun | |

FOREIGN PATENT DOCUMENTS

| | | | |
|---|---|---|---|
| JP | 2002240182 | 8/2002 | |
| JP | 2006021331 | 1/2006 | |
| JP | 2006327098 | 12/2006 | |
| JP | 2008-080704 | 4/2008 | |
| JP | 2008-265096 | 11/2008 | |
| JP | 2011-230320 | 11/2011 | |
| JP | 2012131222 | 7/2012 | |
| JP | 5131590 | 1/2013 | |
| KR | 2011-0094049 | 8/2011 | |
| WO | WO 2008-083304 | 7/2008 | |
| WO | WO 2010-002755 | 1/2010 | |
| WO | WO-2010067857 A1 * | 6/2010 | ........... B32B 27/308 |
| WO | WO 2011-062932 | 5/2011 | |
| WO | WO 2012-003198 | 1/2012 | |
| WO | WO 2012/003417 A | 1/2012 | |
| WO | WO 2012-106184 | 8/2012 | |
| WO | WO 2013-019463 | 2/2013 | |
| WO | WO 2014-025384 | 2/2014 | |
| WO | WO 2014-025385 | 2/2014 | |
| WO | WO 2014-025386 | 2/2014 | |
| WO | WO 2014-025983 | 2/2014 | |
| WO | WO 2014-028677 | 2/2014 | |
| WO | WO 2014-028678 | 2/2014 | |

OTHER PUBLICATIONS

International Search Report for PCT International Application No. PCT/US2013/52633, dated Dec. 6, 2013, 8 pages.

\* cited by examiner

BARRIER FILM CONSTRUCTIONS AND METHODS OF MAKING SAME

CROSS REFERENCE TO RELATED APPLICATIONS

This application is a divisional of U.S. application Ser. No. 14/419,352, filed Feb. 3, 2015, which is a US 371 Application based on PCT/US13/52633, filed on Jul. 30, 2013, which claims the benefit of U.S. Provisional Application No. 61/680,963 filed Aug. 8, 2012, and U.S. Provisional Application No. 61/779,455, filed Mar. 13, 2013.

The present invention was made with Government support under Lot 3053, Contract No. DE-EE0004739 awarded by Department of Energy. The Government has certain rights in this invention.

TECHNICAL FIELD

The present disclosure relates generally to barrier films and methods of making barrier films.

BACKGROUND

Multilayer stacks of polymers and oxides, such as aluminum oxide or silicon oxide, are deposited in a single pass coating process on flexible polymeric films to make barrier films resistant to moisture permeation. These barrier films can be prepared by a variety of production methods, including liquid coating techniques such as solution coating, roll coating, dip coating, spray coating, spin coating; and dry coating techniques such as Chemical Vapor Deposition (CVD), Plasma Enhanced Chemical Vapor Deposition (PECVD), sputtering and vacuum processes for thermal evaporation of solid materials. Examples of such barrier films and processes can be found, for example, in U.S. Pat. No. 5,440,446 (Shaw et al.); U.S. Pat. No. 5,877,895 (Shaw et al.); U.S. Pat. No. 6,010,751 (Shaw et al.); U.S. Pat. No. 7,018,713 (Padiyath et al.); and U.S. Pat. No. 6,413,645 (Graff et al.), all of which are incorporated herein by reference as if fully set forth. These barrier films have a number of applications in the display, lighting, and solar markets as flexible replacements for glass encapsulating materials.

SUMMARY

The inventors of the present application sought to develop barrier films with improved weatherability and resistance to inter-layer delamination.

Some embodiments of a barrier film include a substrate, a base polymer layer adjacent to the substrate, an oxide layer adjacent to the base polymer layer, an adhesion-modifying layer adjacent to the oxide layer; and a top coat polymer layer adjacent to the adhesion-modifying layer. In some embodiments, the top coat polymer includes an acrylate. Optionally, an inorganic layer can be located on the top coat polymer layer. In some embodiments, the adhesion-modifying layer is an adhesion-promoting layer. In other embodiments, the adhesion-modifying layer is a release layer.

Some embodiments of a process for making barrier films includes the steps of providing a substrate, applying a base polymer layer to the substrate, applying an oxide layer to the base polymer layer, applying a adhesion-modifying layer to the oxide layer; and applying a top coat polymer layer on the adhesion-modifying layer.

A separate adhesion-promoting layer provides for enhanced resistance to moisture and improved peel strength adhesion of the top coat layer to the underlying barrier stack layers.

A separate release layer provides for application and subsequent removal of a temporary protective layer to one of the oxide layer and polymer layer, creating an improved barrier assembly. In some embodiments, the protective layer is applied to the oxide layer to protect the oxide layer during processing. Inclusion of the protective layer during processing reduces defect formation in the oxide layer. In some embodiments, the protective layer is subsequently removed from the oxide layer during downstream processing. In some embodiments, the exposed oxide layer is immediately protected by application of an adhesive layer and/or a top sheet or protective liner.

Other features and advantages of the present application are described or set forth in the following detailed specification that is to be considered together with the accompanying two drawings.

BRIEF DESCRIPTION OF THE DRAWINGS

The accompanying drawings are incorporated in and constitute a part of this specification and, together with the description, explain the advantages and principles of the invention. In the drawings.

The figures are not necessarily to scale. It will be understood that the use of a number to refer to a component in a given figure is not intended to limit the component in another figure labeled with the same number.

DETAILED DESCRIPTION

In the following detailed description, reference may be made to the accompanying set of drawings that form a part hereof and in which are shown by way of illustration several specific embodiments. It is to be understood that other embodiments are contemplated and may be made without departing from the scope or spirit of the present disclosure.

Several methods may be useful for producing oxide layers in a multilayer barrier film, as described above. Each of these methods provides unique challenges. In some cases, adhesion between layers in a multilayer barrier film is insufficient for a desired application. For example, polymer layers (e.g., a polyester layer, an acrylate or methacrylate layer) may not have good adhesion to an adjacent polymer layer. Alternatively, polymer layers may not have good adhesion to adjacent oxide layers. Adhesion problems may occur, for example when a sputter process is used for forming oxide layers. In the sputter process, the deposition energy useful for forming a barrier oxide layer is generally high. In contrast, the energy involved in depositing polymer layers is generally low, and this difference in deposition energy may lead to adhesion problems. To increase adhesion between layers, particularly initial adhesion, a thin sputtered layer (e.g., inorganic "tie" layer) of silicon sub-oxide has been shown to be useful. This inorganic tie layer element can then form chemical bonds to both the substrate layer, an oxide, and the polymeric capping layer. The sputter process for making the inorganic tie layer must be carried out with precise power and gas flow settings to improve adhesion performance. This deposition process has historically been susceptible to noise, which results in varied and low adhesion of the polymer layer. Even when the initial adhesion of the barrier stack is acceptable, the adhesion between the sub oxide and polymer layer or between adjacent polymer layers has demonstrated weakness when exposed to accelerated aging conditions of 85° C. and 85% relative humidity. In addition, defects in the oxide layer may occur during processing. Defects in the oxide layer may lower adhesion between polymer and oxide layers, resulting in an increased susceptibility of water ingress, degradation, and/or delamination of the barrier film from the devices it is intended to protect. A more robust solution for making a barrier film is desirable.

The inventors of the present application sought to develop a barrier film with improved weatherability and resistance to inter-layer delamination. In one aspect, the inventors recognized the need to increase adhesion between the layers of the barrier film. In another aspect, the inventors recognized the need to temporarily protect the oxide layer during processing in order to reduce defect formation.

Figure 1:
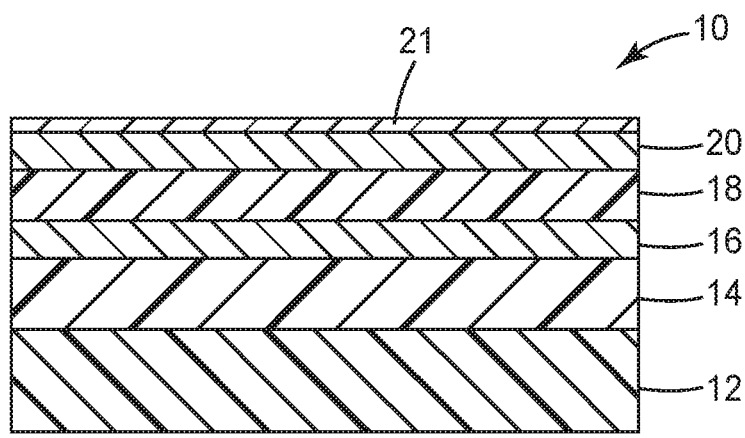
FIG. 1 is a schematic cross-section showing a barrier film having an adhesion-modifying layer.

FIG. 1 is a schematic cross-section of a barrier film 10. Film 10 includes layers arranged in the following order: a substrate 12; a base polymer layer 14; an inorganic layer (e.g., oxide layer) 16; a separate adhesion-modifying layer 18; a top coat polymer layer 20; and an optional inorganic layer 21. Although only two polymer layers (14, 20) and two inorganic layers (16, 21) are shown, film 10 can include additional alternating layers of polymer and oxide between substrate 10 and top coat polymer layer 20 or inorganic layer 21. Despite adhesion-modifying layer 18 being positioned between inorganic layer 16 and top coat polymer layer 20 in FIG. 1, it is to be understood that the adhesion-modifying layer can be present at any polymer-polymer or polymer-oxide interface. Specifically, the adhesion-modifying layer may be disposed between the substrate and the base polymer layer, between the base polymer layer and the oxide layer, between the oxide layer and the top coat polymer layer, and/or above the top coat polymer layer.

In some embodiments, the adhesion-modifying layer 18 is an adhesion-promoting layer, which improves the moisture resistance of film 10 and the peel strength adhesion of the barrier film 10. In other embodiments, the adhesion-modifying layer is a release layer, which may provide for temporary protection of the oxide layer. Exemplary materials for the layers of barrier film 10 are identified below and in the Examples.

Figure 2:
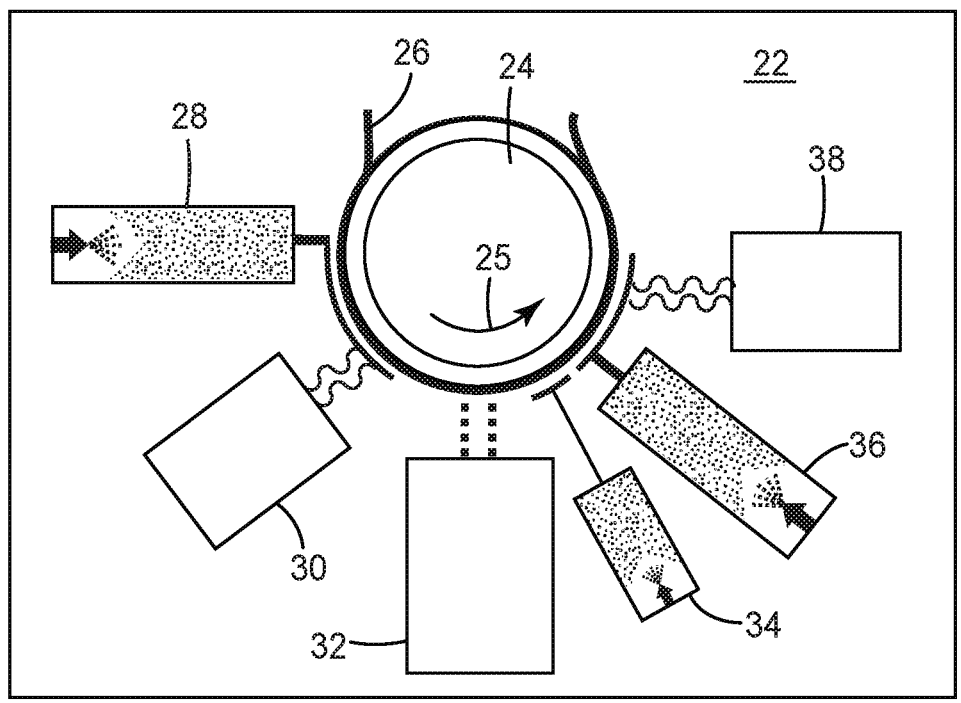
FIG. 2 is a schematic diagram illustrating a process for making a barrier film.

FIG. 2 is a diagram of a system 22, illustrating an exemplary process for making barrier film 10. System 22 is under vacuum and includes a chilled drum 24 for receiving and moving substrate 12, as represented by a film 26, providing a moving web. An evaporator 28 applies a base polymer, which is cured by curing unit 30 to form base polymer layer 14 as drum 24 advances the film in a direction shown by arrow 25. An oxide sputter unit 32 applies an oxide to form inorganic layer 16 as drum 24 advances film 26. For additional alternating layers of base polymer and oxide, drum 24 can rotate in a reverse direction opposite arrow 25 and then advance film 26 again to apply the additional alternating base polymer and oxide layers, and that sub-process can be repeated for as many alternating layers as desired or needed. Once the alternating layers of base polymer and oxide are complete, drum 24 further advances the film, and an evaporator 34 deposits an adhesion-modifying layer. Drum 24 further advances the film, and an evaporator 36 deposits the top coat polymer layer 20. Adhesion-modifying layer 18 and top coat polymer layer 20 can be cured separately. Alternatively, adhesion-modifying layer 18 and top coat polymer layer 20 can be cured together by curing unit 38. Top coat polymer layer 20 can include, for example, a radiation cured monomer (e.g., a (meth)acrylate). The Examples describe in more detail exemplary processes using system 22 to make barrier film 10.

Notwithstanding the system 22 shown in FIG. 2, it is to be understood that adhesion-modifying layers may be present at any interface, as described above. In some embodiments, one or more layers may comprise an adhesion-promoting layer. In other embodiments, one or more layers may comprise a release layer. In yet other embodiments, a first layer may comprise an adhesion-promoting layer, while a second layer may comprise a release layer. Thus, system 22 may comprise additional evaporators and/or curing units or the location of the existing evaporators/curing units may be altered. Alternatively, for additional alternating layers of oxide, adhesion-modifying layer, and top polymer layer, drum 24 can rotate in a reverse direction opposite arrow 25 and then advance film 26 again to apply the additional alternating oxide, adhesion-modifying layer, and top polymer layers. This sub-process can be repeated for as many alternating layers as desired or needed.

Adhesion-promoting materials often have at least one moiety that is reactive with or capable of non-reactive interaction with at least one adjacent layer. In some embodiments, the moieties are reactive and/or capable of non-reactive interaction with both adjacent layers. Exemplary materials for use in the adhesion-promoting layer include, for example, silanes (e.g., silane coupling agents, alkoxy silanes, halo silanes, acetoxy silanes, cyclic aza-silanes, and amino functional silanes), hydroxamic acids, phosphoric acid esters, phosphonic acid esters, phosphonic acids, zirconates, titanates, and the like, all of which may have additional reactive groups such as, for example, (meth)acrylate and epoxy. Other suitable adhesion-promoting materials include those described in the following copending applications filed the same date as the present application: "Barrier Film, Method of Making the Barrier Film, and Articles Including the Barrier Film" 61/680,995, "Composite Layers Including Urea Acrylate Silanes" 61/681,023, "Composite Layers Including Diurethane Silanes" 61/681,008, and "Composite Layers Including Urea Urethane Acrylate Silanes" 61/681,003, all of which are incorporated herein by reference.

In some embodiments, the adhesion-promoting layer is a silane coupling agent. A characteristic of this type of material is its ability to react with metal-hydroxyl (metal-OH) groups on a freshly sputter deposited metal oxide layer, such as, for example, a freshly sputtered $SiO_2$ layer with surface hydroxyl-silanol (Si—OH) groups. The amount of water vapor present in a multi-process vacuum chamber can be controlled sufficiently to promote the formation of Si—OH groups in high enough surface concentration to provide increased bonding sites. With residual gas monitoring and the use of water vapor sources, the amount of water vapor in a vacuum chamber can be controlled to ensure adequate generation of Si—OH groups.

Typically, adhesion between the release layer and at least one adjacent layer is low enough to enable the removal of said adjacent layer under appropriate conditions, but not so low that the layers prematurely separate by forces normally encountered in normal handling and processing operations. Exemplary materials used in the release layer include silicones, fluorinated materials (e.g., monomers, oligomers, or polymers containing fluoroalkyl or fluoroalkylene or perfluoropolyether moieties), soluble materials, alkyl chains (e.g., straight, branched, and/or cyclic hydrocarbon moieties containing 12-36 carbon atoms), and the like.

The films and processes described herein improve the overall adhesion and adhesion retention of vapor deposited multilayer barrier coatings after exposure to moisture by the addition of a separate adhesion-modifying layer. In some embodiments, the adhesion-modifying layer is applied in a vapor coating process where the adhesion-modifying layer adsorbs or condenses onto a moving web substrate that has just been sputter coated with an oxide of silicon and aluminum. The adsorbed or condensed layer may then be exposed to subsequent processing steps, for example to curing (e.g., electron beam radiation), additional inorganic layer sputtering, and/or or additional polymer layer deposition. With the addition of the adhesion-promoting layer the peel strength adhesion is greatly improved, especially after exposure to high heat and humidity conditions. Additionally, the addition of the adhesion-modifying layer removes the need for a tie layer, which greatly simplifies the coating process and barrier coating stack construction. The resulting barrier coatings retain high barrier properties and optical transmission performance.

Exemplary polymers for use in the substrate, base polymer layer and/or top coat polymer layer include those listed in U.S. Patent Application Publication No. 2012/0003448 (Weigel et al), incorporated herein by reference in its entirety.

The barrier films of the present application may further comprise a top sheet. In some embodiments, the top sheet is adhered to the barrier film by means of a pressure sensitive adhesive. Useful materials that can form the top sheet include polyesters, polycarbonates, polyethers, polyimides, polyolefins, fluoropolymers, and combinations thereof. Exemplary materials for use in the top sheet include those listed in U.S. Patent Application Publication No. 2012/0003448 (Weigel et al), incorporated herein by reference in its entirety.

In embodiments, the barrier films of the present application are used for encapsulating solar devices. In such embodiments, it is typically desirable for the top sheet to be resistant to degradation by ultraviolet (UV) light and weatherable. Photo-oxidative degradation caused by UV light (e.g., in a range from 280 to 400 nm) may result in color change and deterioration of optical and mechanical properties of polymeric films. The top sheets described herein can provide, for example, a durable, weatherable topcoat for a photovoltaic device. The substrates are generally abrasion and impact resistant and can prevent degradation of, for example, photovoltaic devices when they are exposed to outdoor elements.

In some exemplary embodiments, flexible electronic devices can be encapsulated directly with the methods described herein. For example, the devices can be attached to a flexible carrier substrate, and a mask can be deposited to protect electrical connections from the inorganic layer(s), (co)polymer layer(s), or other layer(s)s during their deposition. The inorganic layer(s), (co)polymeric layer(s), and other layer(s) making up the multilayer barrier assembly can be deposited as described elsewhere in this disclosure, and the mask can then be removed, exposing the electrical connections.

In one exemplary direct deposition or direct encapsulation embodiment, the moisture sensitive device is a moisture sensitive electronic device. The moisture sensitive electronic device can be, for example, an organic, inorganic, or hybrid organic/inorganic semiconductor device including, for example, a photovoltaic device such as a copper indium gallium (di)selenide (CIGS) solar cell; a display device such as an organic light emitting display (OLED), electrochromic display, electrophoretic display, or a liquid crystal display (LCD) such as a quantum dot LCD display; an OLED or other electroluminescent solid state lighting device, or combinations thereof and the like.

Examples of suitable processes for making a multilayer barrier assembly and suitable transparent multilayer barrier coatings can be found, for example, in U.S. Pat. No. 5,440,446 (Shaw et al.); U.S. Pat. No. 5,877,895 (Shaw et al.); U.S. Pat. No. 6,010,751 (Shaw et al.); and U.S. Pat. No. 7,018,713 (Padiyath et al.). In one presently preferred embodiment, the barrier assembly in an article or film can be fabricated by deposition of the various layers onto the substrate, in a roll-to-roll vacuum chamber similar to the system described in U.S. Pat. No. 5,440,446 (Shaw et al.) and U.S. Pat. No. 7,018,713 (Padiyath, et al.).

EXAMPLES

All parts, percentages, and ratios in the examples are by weight, unless noted otherwise. Solvents and other reagents used were obtained from Sigma-Aldrich Chemical Company; Milwaukee, Wis. unless specified differently.

Preparation of Comparative Laminate Construction a and Laminate Constructions 1-2.

Comparative Laminate Construction A and Laminate Constructions 1-2 were prepared by using a 0.05 mm thick pressure sensitive adhesive (PSA) (obtained under the trade designation "3M OPTICALLY CLEAR ADHESIVE 8172P" from 3M Company, St. Paul, Minn.) to laminate 22.9 cm by 15.2 cm barrier films to an ethylene tetrafluoroethylene polymer sheet (ETFE) (0.05 mm thick, available under the trade designation "NORTON ETFE", from St. Gobain Performance Plastics, Wayne, N.J.), with the top coat polymer layer of the barrier film adjacent the ETFE sheet. Comparative Laminate Construction A and Laminate Constructions 1-2 were prepared using barrier films of, respectively, Comparative Example A, and Examples 1-2. The polyethylene terephtalate (PET) side of the barrier film was then placed on the polytetrafluoroethylene (PTFE) side of a 0.14 mm (0.0056 in) thick 21.6 cm by 14 cm PTFE-coated aluminum foil (obtained under the trade designation "8656K61", from McMaster-Carr, Santa Fe Springs, Calif.). The PTFE-coated aluminum foil was 1.27 cm smaller than the barrier film in each dimension, thus leaving a portion of the PET exposed. A 13 mm (0.5 in) wide desiccated edge tape (obtained under the trade designation "SOLARGAIN EDGE TAPE SET LP01" from Truseal Technologies Inc., Solon, Ohio) was placed around the perimeter of the PTFE-coated aluminum foil to secure the laminated barrier sheet to the PTFE layer. A 0.38 cm (0.015 in) thick encapsulant film (obtained under the trade designation "JURASOL" from JuraFilms, Downer Grove, Ill.) was placed on the aluminum side of the PTFE-coated aluminum foil. The PET layer of a second laminated barrier sheet, identical in composition to the first laminated barrier sheet, was disposed over the encapsulant film, to form a laminate construction. The construction was vacuum laminated at 150° C. for 12 min.

Test Methods

Spectral Transmission

Spectral transmission was measured using a spectrometer (model "LAMBDA 900", commercially available from PerkinElmer, Waltham, Mass.). Spectral transmission is reported as average percent transmission (Tvis) between 400 nm and 700 nm at a 0° angle of incidence.

Water Vapor Transmission Rate

Water vapor transmission rate (WVTR) of the barrier films of Comparative Example A and Examples 1-2, was measured in accordance with the procedure outlined in ASTM F-1249-06, "Standard Test Method for Water Vapor Transmission Rate Through Plastic Film and Sheeting Using a Modulated Infrared Sensor", using a MOCON PERMA-TRAN-W® Model 700 WVTR testing system (obtained from MOCON, Inc, Minneapolis, Minn.). Temperature of about 50° C. and relative humidity (RH) of about 100% were used and WVTR is expressed in grams per square meter per day (g/m2/day). The lowest detection limit of the testing system was 0.005 g/m2/day. In some instances, the measured WVTR was below the lowest detection limit and is reported as <0.005 g/m2/day.

Aging Test

Laminate constructions prepared with barrier films of Comparative Example A and Examples 1-2, were placed in an environmental chamber (model "SE-1000-3", obtained from Thermotron Industries, Holland, Mich.) set to a temperature of about 85° C. and relative humidity of about 85%, for 0 (initial), 250, and 500 hours.

T-Peel Test Method

Aged and unaged barrier films of Comparative Example A, and Examples 1 and 2 were removed from the laminate construction by peeling off the PTFE layer. The barrier films were then cut into 1.0 in wide (2.54 cm) sections. These sections were placed in a tensile strength tester (obtained under the trade designation "INISIGHT 2 SL" with Testworks 4 software from MTS, Eden Prairie, Minn.), following the procedure outlined in ASTM D 1876-08 "Standard Test Method for Peel Resistance of Adhesives (T-Peel Test) ." A peel speed of 254 mm/min (10 inches/min) was used. Adhesion is reported in Newton per centimeter (N/cm) as the average of four peel measurements between 0.05 and 5.95 cm.

Comparative Example A

Barrier films were prepared by covering a polyetheylene teraphthalate (PET) substrate film (obtained from E. I. DuPont de Nemours, Wilmington, Del., under the trade name "XST 6642") with a stack of an base polymer layer, an inorganic silicon aluminum oxide (SiAlOx) barrier layer, and an top coat polymer layer on a vacuum coater similar to the coater described in U.S. Pat. No. 5,440,446 (Shaw et al.) and U.S. Pat. No. 7,018,713 (Padiyath, et al), both of which are incorporated herein by reference. The individual layers were formed as follows:

Layer 1 (base polymer layer): a 350 meter long roll of 0.127 mm thick×366 mm wide PET film was loaded into a roll-to-roll vacuum processing chamber. The chamber was pumped down to a pressure of $1 \times 10^{-5}$ Torr. A web speed of 4.8 meter/min was held while maintaining the backside of the PET film in contact with a coating drum chilled to −10° C. With the backside in contact with the drum, the film frontside surface was treated with a nitrogen plasma at 0.02 kW of plasma power. The film frontside surface was then coated with tricyclodecane dimethanol diacrylate monomer (obtained under the trade designation "SR-833S", from Sartomer USA, Exton, Pa.). The monomer was degassed under vacuum to a pressure of 20 mTorr prior to coating, loaded into a syringe pump, and pumped at a flow rate of 1.33 mL/min through an ultrasonic atomizer operating at a frequency of 60 kHz into a heated vaporization chamber maintained at 260° C. The resulting monomer vapor stream condensed onto the film surface and was electron beam crosslinked using a multi-filament electron-beam cure gun operating at 7.0 kV and 4 mA to form a 720 nm thick base polymer layer.

Layer 2 (inorganic layer): immediately after the base polymer layer deposition and with the backside of the PET film still in contact with the drum, a SiAlOx layer was sputter-deposited atop a 23 m length of the base polymer layer. Two alternating current (AC) power supplies were used to control two pairs of cathodes; with each cathode housing two 90% Si/10% Al sputtering targets (obtained from Materion Corporation, Mayfield Heights, Ohio). During sputter deposition, the voltage signal from each power supply was used as an input for a proportional-integral-differential control loop to maintain a predetermined oxygen flow to each cathode. The AC power supplies sputtered the 90% Si/10% Al targets using 5000 watts of power, with a gas mixture containing 450 standard cubic centimeter per minute (sccm) argon and 63 sccm oxygen at a sputter pressure of 3.5 millitorr. This provided a 30 nm thick SiAlOx layer deposited atop the base polymer layer of Layer 1.

Layer 3 (top coat polymer layer): immediately after the SiAlOx layer deposition and with the backside of the PET film still in contact with the drum, the acrylate monomer (same monomer of Layer 1) was condensed onto Layer 2 and crosslinked as described in Layer 1, except that a multi-filament electron-beam cure gun operating at 7 kV and 5 mA was used. This provided a 720 nm thick top coat polymer layer atop Layer 2.

Initial T-peel adhesion, spectral transmission (Tvis) and water vapor transmission rate (WVTR) of the barrier film of Comparative Example A were measured using the test methods described above. The barrier film was then aged, following the procedure outlined above, for 250 and 500 hours. T-peel adhesion was measured for the aged sample. Results are reported in Table 1, below.

Example 1

A barrier film was prepared as described in Comparative Example A, with the exception that an adhesion-promoting material was deposited over (i.e., vaporized and condensed) Layer 2 and immediately prior to deposition and condensation of the top coat polymer layer (Layer 3). The barrier film was subsequently e-beam crosslinked as described in Comparative Example A.

A cyclic azasilane (obtained under the trade designation "1932.4", from Gelest, Morrisville, Pa.) was used as adhesion-promoting material.

Initial T-peel adhesion, spectral transmission (Tvis) and water vapor transmission rate (WVTR) of the barrier film of Example 1 were measured using the test methods described above. The barrier film was then aged, following the procedure outlined above, for 250 and 500 hours. T-peel adhesion was measured for the aged sample. Results are reported in Table 1, below.

Example 2

A barrier film was prepared as described in Example 1, with the exception that the adhesion-promoting material was (3-acryloxypropyl) trimethoxysilane (obtained under the trade designation "SIA0A200.0" from Gelest).

Initial T-peel adhesion, spectral transmission (Tvis) and water vapor transmission rate (WVTR) of the barrier film of Example 2 were measured using the test methods described above. The barrier film was then aged, following the procedure outlined above, for 250 and 500 hours. T-peel adhesion was measured for the aged sample. Results are reported in Table 1, below.

TABLE 1

| Examples | Spectral Transmission (%) | WVTR (g/m2/day) | T-peel adhesion (N/cm) | | |
|---|---|---|---|---|---|
| | | | Initial | 250 hours | 500 hours |
| Comparative Example A | 87 | <0.005 | 0.2 | 0.1 | 0.1 |
| Example 1 | 87 | <0.005 | 4.0 | 8.2 | 1.2 |
| Example 2 | 87 | <0.005 | 8.4 | 9.9 | 10.3 |

All references mentioned herein are incorporated by reference.

As used herein, the words "on" and "adjacent" cover both a layer being directly on and indirectly on something, with other layers possibly being located therebetween.

As used herein, the terms "major surface" and "major surfaces" refer to the surface(s) with the largest surface area on a three-dimensional shape having three sets of opposing surfaces.

Unless otherwise indicated, all numbers expressing feature sizes, amounts, and physical properties used in the present disclosure and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this disclosure and the appended claims, the term "or" is generally employed in its sense including "and/or" unless the content clearly dictates otherwise.

Various embodiments and implementation of the present disclosure are disclosed. The disclosed embodiments are presented for purposes of illustration and not limitation. The implementations described above and other implementations are within the scope of the following claims. One skilled in the art will appreciate that the present disclosure can be practiced with embodiments and implementations other than those disclosed. Those having skill in the art will appreciate that many changes may be made to the details of the above-described embodiments and implementations without departing from the underlying principles thereof. It should be understood that this invention is not intended to be unduly limited by the illustrative embodiments and examples set forth herein and that such examples and embodiments are presented by way of example only with the scope of the invention intended to be limited only by the claims set forth herein as follows. Further, various modifications and alterations of the present invention will become apparent to those skilled in the art without departing from the spirit and scope of the present disclosure. The scope of the present application should, therefore, be determined only by the following claims.

The invention claimed is:

1. A process for making a barrier film, comprising:
   providing a (co)polymeric film substrate;
   applying a first polymer material as a first polymer layer on and contacting the substrate wherein applying the first polymer material comprises evaporating the first polymer material, depositing the evaporated first polymer material onto the substrate and curing the first polymer material to form the first polymer layer;
   applying a first oxide material onto and contacting the first polymer material;
   vapor-depositing an adhesion-modifying release material comprising a silicone or fluorinated polymer over and contacting the first oxide material; and
   forming a second polymer layer on the adhesion-modifying release material.

2. The process of claim 1, wherein applying the first oxide material comprises sputter depositing the first oxide material onto the first polymer layer.

3. The process of claim 1, wherein the second polymer layer includes a radiation cured (meth)acrylate monomer.

4. The process of claim 1, further comprising:
   curing at least one of the adhesion-modifying release material and the second polymer layer.

5. The process of claim 1, wherein the first polymer material includes an acrylate.

* * * * *

UNITED STATES PATENT AND TRADEMARK OFFICE
CERTIFICATE OF CORRECTION

| | | |
|---|---|---|
| PATENT NO. | : 10,947,618 B2 | Page 1 of 1 |
| APPLICATION NO. | : 16/266254 | |
| DATED | : March 16, 2021 | |
| INVENTOR(S) | : Joe Spagnola | |

It is certified that error appears in the above-identified patent and that said Letters Patent is hereby corrected as shown below:

In the Specification

Column 1
Line 8, Delete "US" and insert -- U.S. --, therefor.

Column 4
Line 40, Delete "61/680,995," and insert -- 61/680,955, --, therefor.

Column 6
Line 40, Delete "terephtalate" and insert -- terephthalate --, therefor.

Column 7
Line 29, Delete ""INISIGHT" and insert -- "INSIGHT --, therefor.
Line 40-41, Delete "polyetheylene teraphthalate" and insert -- polyethylene terephthalate --, therefor.

In the Claims

Column 10
Line 22, Claim 1, delete "substrate" and insert -- substrate, --, therefor.

Signed and Sealed this
Eleventh Day of January, 2022

Drew Hirshfeld
*Performing the Functions and Duties of the
Under Secretary of Commerce for Intellectual Property and
Director of the United States Patent and Trademark Office*